United States Patent
Sato et al.

(10) Patent No.: US 8,815,387 B2
(45) Date of Patent: Aug. 26, 2014

(54) COPPER FOIL WITH ULTRA THIN ADHESIVE LAYER, AND A METHOD FOR MANUFACTURING THE COPPER FOIL WITH ULTRA THIN ADHESIVE LAYER

(75) Inventors: Tetsuro Sato, Ageo (JP); Toshifumi Matsushima, Ageo (JP)

(73) Assignee: Mitsu Minning & Smelting Co., Ltd., Tokyo (JP)

( * ) Notice: Subject to any disclaimer, the term of this patent is extended or adjusted under 35 U.S.C. 154(b) by 1225 days.

(21) Appl. No.: 10/565,587

(22) PCT Filed: Jul. 15, 2004

(86) PCT No.: PCT/JP2004/010101
§ 371 (c)(1),
(2), (4) Date: Feb. 22, 2007

(87) PCT Pub. No.: WO2005/009093
PCT Pub. Date: Jan. 27, 2005

(65) Prior Publication Data
US 2007/0243402 A1    Oct. 18, 2007

(30) Foreign Application Priority Data
Jul. 22, 2003  (JP) .................... 2003-277428
Jun. 10, 2004  (JP) .................... 2004-172985

(51) Int. Cl.
*B32B 15/08*   (2006.01)
*B32B 15/20*   (2006.01)
*H05K 3/38*   (2006.01)

(52) U.S. Cl.
USPC ........... 428/336; 428/332; 428/416; 428/418; 428/457; 428/458; 427/386; 427/409; 427/410

(58) Field of Classification Search
None
See application file for complete search history.

(56) References Cited

U.S. PATENT DOCUMENTS 5,439,986 A * 8/1995 Hosogane et al. ............ 525/423
5,525,433 A * 6/1996 Poutasse et al. ............. 428/674
5,622,782 A * 4/1997 Poutasse et al. ............. 428/344

(Continued)

FOREIGN PATENT DOCUMENTS

EP    0612812    8/1994
JP    05-029740    5/1993

(Continued)

*Primary Examiner* — Monique Jackson
(74) *Attorney, Agent, or Firm* — Greenblum & Bernstein, P.L.C.

(57) ABSTRACT

The object of the present invention is to provide a copper foil with an ultra thin resin layer for a printed wiring board without roughening treatment. In order to achieve the object, there is adopted a copper foil with an ultra thin adhesive layer for a printed wiring board 1 or the like, which is a copper foil provided with an ultra thin primer resin layer for securing good laminating adhesiveness with a resin base material on one side of a copper foil 3 without roughening treatment, characterized in that a silane coupling agent layer 2 is formed on a surface of the copper foil without the roughening treatment having a surface roughness (Rz) of 2 μm or below, and an ultra thin primer resin layer 4 having a converted thickness of 1 to 5 μm is formed on the silane coupling agent layer 2.

15 Claims, 1 Drawing Sheet

(56) References Cited

U.S. PATENT DOCUMENTS

| | | | |
|---|---|---|---|
| 5,686,172 A * | 11/1997 | Ohya et al. | 156/89.28 |
| 5,994,480 A | 11/1999 | Wang et al. | |
| 6,124,408 A | 9/2000 | Wang et al. | |
| 6,265,498 B1 | 7/2001 | Wang et al. | |
| 6,294,621 B1 | 9/2001 | Wang et al. | |
| 6,306,980 B1 | 10/2001 | Wang et al. | |
| 6,447,915 B1 * | 9/2002 | Komiyatani et al. | 428/416 |
| 6,451,932 B1 | 9/2002 | Wang et al. | |
| 6,733,869 B2 * | 5/2004 | Arakawa et al. | 428/195.1 |
| 7,651,783 B2 | 1/2010 | Tsuchida et al. | |
| 2003/0091842 A1 | 5/2003 | Asano et al. | |

FOREIGN PATENT DOCUMENTS

| | | | |
|---|---|---|---|
| JP | 10-190225 A | | 7/1998 |
| JP | 11-10794 A | | 1/1999 |
| JP | 11-148053 A | | 6/1999 |
| JP | 2000-196207 A | | 7/2000 |
| JP | 2001-114981 A | | 4/2001 |
| JP | 2003-133666 A | | 5/2003 |
| JP | 2003133666 A | * | 5/2003 |
| JP | 2003-174247 A | | 6/2003 |
| JP | 2003-201585 A | | 7/2003 |
| JP | 2003229648 A | * | 8/2003 |
| WO | WO03/038149 | | 5/2003 |

* cited by examiner

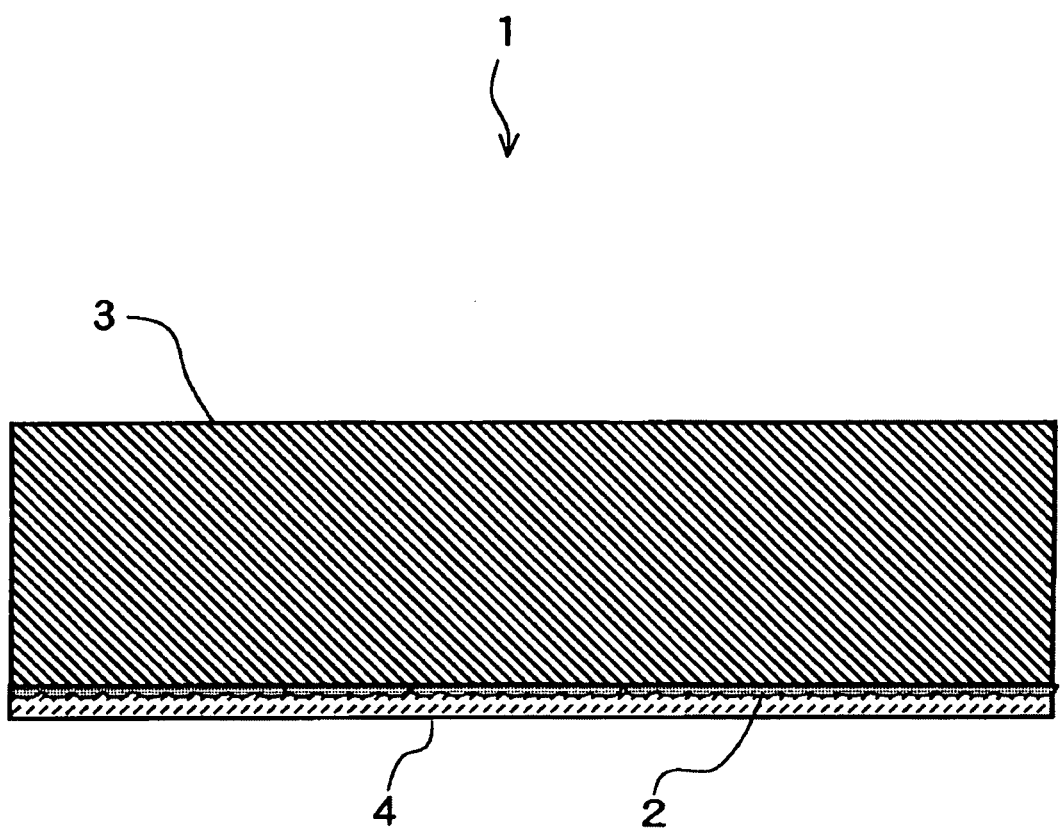

US 8,815,387 B2

COPPER FOIL WITH ULTRA THIN ADHESIVE LAYER, AND A METHOD FOR MANUFACTURING THE COPPER FOIL WITH ULTRA THIN ADHESIVE LAYER

CROSS-REFERENCE TO RELATED APPLICATION

This application is a 35 USC §371 National Phase Entry Application from PCT/JP2004/010101, filed Jul. 15, 2004, and designating the United States.

TECHNICAL FIELD

The present invention relates to a copper foil with an ultra thin adhesive layer that can secure good laminating adhesiveness with a resin substrate for a printed wiring board, such as prepreg and paper-phenol base material, without the roughening treatment of a copper foil, and a method for manufacturing such a copper foil with an ultra thin adhesive layer.

BACKGROUND ART

As disclosed in Patent Document 1 (below-noted) as well as a large number of references, a copper foil for a conventional printed wiring board is undergone a roughening treatment for forming irregularity by adhering fine copper particles or the like on one surface thereof. When laminating with a base-material resin, such as prepreg, the irregular shape of the roughened copper foil is buried in the base-material resin to obtain an anchor effect, and the adhesiveness of the copper foil to the base-material resin has been obtained.

To take the case of an electrolytic copper foil as an example, the conventional electrolytic copper foil for a printed wiring board is manufactured through an electrolysis step and a surface-treatment step. A bulk copper layer, which is the base material of the electrolytic copper foil, is obtained by flowing a copper electrolyte between a drum-shaped rotating cathode and a lead-based anode disposed facing along the shape of the rotating cathode; depositing copper on the drum surface of the rotating cathode utilizing an electrolytic reaction to be a state of a copper foil; and continuously peeling the foil off the rotating cathode. The copper foil in this stage is herein referred to as an untreated foil.

Since the shape of the mirror-finished surface of the rotating cathode is transferred to the surface of the untreated foil that has contacted the rotating cathode, and the surface is shinny and flat, it is referred to as a shinny surface. Whereas, since the crystal growth rate of the deposited copper is different for each crystal face, the surface shape of the solution side, which is the depositing side, shows a mountain-shaped irregularity, and it is referred to as a rough surface. Normally, the rough surface becomes the surface for laminating with the insulation material when a copper-clad laminate is manufactured.

Next, the untreated foil is undergone the roughening treatment and anticorrosive treatment to the rough surface by the surface-treatment step. The roughening treatment to the rough surface prevents the dropout of fine copper particles by supplying the current of so-called burn-plating conditions in a copper sulfate solution to deposit fine copper particles on the mountain-shaped irregularity of the rough surface, and immediately performing cover plating in the current range of the flat-plating conditions. Therefore, the rough surface after depositing fine copper particles is referred to as a "roughening-treated surface". Then, an anticorrosive treatment or the like is performed as required, to complete an electrolytic copper foil.

In recent years, however, following the trend of miniaturization and sophistication of electronic devices incorporating printed wiring boards, requirements for the wiring density of printed wiring boards are increasing every year. Moreover, the improvement as the product quality has been demanded, there have been the high degree of requirements circuit shapes themselves formed by etching, and circuit etching factors of the level wherein impedance control can be perfectly performed have been demanded.

Therefore, in order to solve the problems of the etching factors of such a circuit, as disclosed in Patent Document 2 (below-noted), there have been attempts to obtain good laminating adhesiveness without the roughening treatment by providing two resin layers having different compositions for securing adhesion to the base-material resin on the surface of a copper foil without the roughening treatment.

Patent Document 1: Japanese Patent Laid-Open No. 05-029740

Patent Document 2: Japanese Patent Laid-Open No. 11-10794

DISCLOSURE OF THE INVENTION

Problems to be Solved by the Invention

However, as far as the present inventors know, it has been known that stable adhesiveness to the base-material resin cannot been obtained by the surface of the copper foil without roughening treatment, even if the copper foil with a resin disclosed in Patent Document 2. Moreover, since two resin layers having different compositions were provided, the manufacture of the resin layers required two or more painting steps, and incurred increase in manufacturing costs.

On the other hand, if a copper foil without roughening treatment could be used for the manufacture of a printed wiring board, the roughening-treatment step of the above-described copper foil could be omitted. As a result, the production costs can be significantly reduced, and in fact, it can be possible to win the recent international cost competition. Moreover, if there is no roughening treatment of the copper foil, it is considered that no provision of over-etching time for dissolving the roughened portion in circuit etching is required, total etching costs can be reduced, and the etching factors of the obtained circuit can be dramatically improved.

From the above facts, the use of a copper foil without roughening treatment in the printed wiring board was a technique that was almost given up in the art. In other words, if a copper foil without roughening treatment be used in the manufacture of a printed wiring board, the total manufacturing costs of the printed wiring board can be significantly reduced, and effects imparted to the market becomes immeasurable.

Means for Solving the Problems

Therefore, as a result of keen examinations, the present inventors have reached the idea of a copper foil with an ultra thin adhesive layer according to the present invention. The "copper foil with an ultra thin adhesive layer" and a "method for manufacturing the copper foil with an ultra thin adhesive layer" will be separately described below.

<Copper Foil with an Ultra Thin Adhesive Layer>

A copper foil with an ultra thin adhesive layer 1 according to the present invention has a cross section schematically shown in FIG. 1. Here, although a silane coupling agent layer 2 is extremely clearly illustrated, it is not identified to be a complete layer in a real product even if observed through a transmission electron microscope, but is for easier understanding the following description. There is also a case where in the silane coupling agent layer 2 is absent, and the image in such a case can be easily imagined from FIG. 1. Specifically, if the copper foil with an ultra thin adhesive layer 1 according to the present invention is most simply expressed, it is a copper foil 3 not undergone a roughening treatment provided with an ultra thin resin on one surface. In the case of the copper foil with an ultra thin resin layer according to the present invention, the ultra thin resin layer is referred to as an "ultra thin primer resin layer 4". Therefore, as far as judged from the schematic cross section, it can be seen that the resin layer of a conventional product called a resin-coated copper foil was simply thinned.

In reality, the object of the present invention can be achieved by "a copper foil provided with an ultra thin primer adhesive layer for securing good laminating adhesiveness with a resin base material on one side of a copper foil without roughening treatment, which is a copper foil with an ultra thin adhesive layer for a printed wiring board characterized in that a ultra thin primer resin layer of a converted thickness of 1 to 5 μm is provided on a silane coupling agent layer provided on a surface of a copper foil having a surface roughness (Rz) of 2 μm or less not undergone the roughening treatment."

First, the term "copper foil without roughening treatment" used herein clarifies that the kind and thickness of the electrolytic copper foil, the rolled copper foil or the like are not specifically limited. Moreover, in the case of an electrolytic copper foil, the both surfaces, that is, the shinny surface and the rough surface are considered to be subjects. In the copper foil used herein, although roughening treatment is omitted, it is described in the meaning that an anticorrosive treatment can be included. The anticorrosive treatment used herein includes inorganic corrosion prevention using zinc, brass or the like, organic corrosion prevention using organic agents such as benzotriazole, imidazole or the like, or the like.

Here, the reason why the surface roughness (Rz) of the copper foil without roughening treatment is 2 μm or less is that there is the rough surface having a surface roughness slightly exceeding 2 μm, even in the case of a rough surface without roughening treatment. In the present invention, however, the rough surface of an electrolytic copper foil is not used, and by the presence of an ultra thin primer resin layer, a sufficient adhesive strength to the base-material resin can be obtained even in the shinny surface (Rz is 1.8 μm or below).

A silane coupling agent layer plays a role to improve the wetness of the surface of the copper foil without roughening treatment and the ultra thin primer resin layer, and a role as an additive for improving the adhesion when press work is performed to the base-material resin. Heretofore, it has been said that the higher peel strength of the circuit off the printed wiring board is better. However, due to the improvement of the accuracy of etching techniques in recent years, there has been no circuit peeling during etching, the method for handling printed wiring boards has been established in the printed wiring board industry, and the problems of wire breaking and delamination caused by erroneously hitching the circuit have been solved. Therefore, it is recently said that if the peel strength is at least 0.8 kgf/cm or more, the actual use is possible, and if it is 1.0 kgf/cm or more, there is no problem. When this is considered, by using the most generally-used epoxy-functional silane coupling agents, as well as olefin-functional silanes and acrylic-functional silanes, when FR-4 prepreg is laminated, and the peel strength is measured, the peel strength of about 0.8 kgf/cm can be obtained. However, if an amino-functional silane coupling agent or a mercapto-functional silane coupling agent is used, the peel strength becomes 1.0 kgf/cm or more, which is especially preferable.

The methods for forming the silane coupling agent layer are not specifically limited, and include a generally used dipping method, a showering method, and a spray method. A method that can allow the copper foil to contact and adsorb a solution containing a silane coupling agent most uniformly can be optionally adopted corresponding to the process design.

Silane coupling agents that can be used here will be more specifically stated. Centered on coupling agents similar to those used in the glass cloth of prepreg for printed wiring boards, vinyl trimethoxysilane, vinylphenyl trimethoxysilane, γ-methacryloxypropyl trimethoxysilane, γ-glycidoxypropyl trimethoxysilane, 4-glycidylbutyl trimethoxysilane, γ-aminopropyl triethoxysilane, N-β (aminoethyl) γ-aminopropyl trimethoxysilane, N-3-(4-(3-aminopropoxy) butoxy) propyl-3-aminopropyl trimethoxysilane, imidazolesilane, triazinesilane, γ-mercaptopropyl trimethoxysilane and the like can be used.

These silane coupling agents are dissolved in 0.5 to 10 g/l of the water as the solvent, and used at a temperature of a room temperature level. The silane coupling agent forms a film by condensation bonding with OH groups protruded on the surface of the copper foil, and even if a solution of an excessively high concentration is used, the effect is not markedly enhanced. Therefore, it should be primarily determined according to the treatment speed of the process. However, if the concentration is lower than 0.5 g/l, the adsorption rate of the silane coupling agent is low, it is not commercially profitable, and adsorption becomes uneven. Furthermore, even if the concentration exceeds 10 g/l, the adsorption rate is not enhanced, and becomes uneconomical.

Next, the ultra thin primer resin layer is a very thin resin layer having a thickness of 1 μm to 5 μm. The reason why such a thin resin layer is used is for creating the state wherein resin flow does not substantially occur during the hot-press process for laminating the copper foil with an ultra thin adhesive layer according to the present invention to the resin base material such as prepreg. In the lamination of a conventional copper foil to a resin base material, there is irregularity on the roughened surface of the copper foil to cause the incorporation of the air, and combining the removal of the air, a resin flow of about 5 mm to 15 mm from the edges of a copper-clad laminate of a 1 m² size has been intentionally allowed to occur. However, in the case of the copper foil with an ultra thin adhesive layer according to the present invention, it is the most important factor that the resin flow does not substantially occur for securing good adhesiveness to the base material resin, even on the surface of the copper foil without roughening treatment.

In this description, the resin flow is judged by the value when measured in accordance with MIL-P-13949G in the MIL Standard. Specifically, 4 samples of 10-cm square were sampled from a copper foil with an ultra thin adhesive layer according to the present invention, and the 4 samples were laminated in the superimposed state under conditions of a pressing temperature of 171° C., a pressing pressure of 14 kgf/cm², and a pressing time of 10 minutes, and the resin flow at that time was calculated using Formula 1. However, in the measurement of the resin flow in this description, since the fineness of the measurement accuracy cannot be obtained if the copper foil with an ultra thin adhesive layer according to the present invention is used as it is, a resin layer having a thickness of 40 μm was intentionally manufactured, and it is used as a sample. For reference, the resin flow when a normal prepreg is used, and of a normal copper foil with a resin (resin layer of a thickness of 40 μm) is about 20%.

$$\text{Resin flow (\%)} = \frac{\text{Quantity of outflow resin}}{(\text{Weight of laminate}) - (\text{weight of copper foil})} \times 100 \quad [\text{Formula 1}]$$

This is because if the thickness of the ultra thin primer resin layer is less than 1 μm, coating the surface of a copper foil that is seemed to be flat and free of irregularity in a uniform thickness becomes difficult. On the other hand, if the thickness of the ultra thin primer resin layer exceeds 5 μm, delamination at the boundary with the underlying base material or prepreg occurs easily. The thickness of the ultra thin primer resin layer is a converted thickness when considered to be applied to 1 m$^2$ of a perfect plane.

Here, the resin composition for constituting the ultra thin primer resin layer will be described. The resin composition used in the present invention can be roughly divided into two kinds, and the "first resin composition" and the "second resin composition" will be separately described below.

(First Resin Composition)

The first resin composition is composed of an epoxy resin, a curing agent, an aromatic polyamide resin polymer soluble in a solvent, and a curing accelerating agent added as required in an adequate quantity.

The "epoxy resin" called here has two or more epoxy groups in a molecule, and can be used without problems as long as it can be used in electrical applications. Among these, it is preferable to use one or the combination of two or more selected from a group consisting of a bisphenol A-type epoxy resin, a bisphenol F-type epoxy resin, a bisphenol S-type epoxy resin, a novolak-type epoxy resin, a cresol novolak-type epoxy resin, an alicyclic epoxy resin, a brominated epoxy resin, and a glycidyl amine-type epoxy resin.

The epoxy resin accounts for the most part of the resin composition, and is used in the compounding proportion of 20 parts by weight to 80 parts by weight. However, it is considered here to contain a curing agent described below. Therefore, when the content of the epoxy resin in the state of containing the curing agent is less than 20 parts by weight, the thermosetting properties are not sufficiently exerted, and the function as the binder to the base-material resin and the adhesion with the copper foil cannot be exhibited; and if the content exceeds 80 parts by weight, the viscosity when the resin solution is formed becomes excessively high making the application to the surface of the copper foil in a uniform thickness difficult, the balance with the quantity of the added aromatic polyamide resin polymer described below cannot be achieved, and a sufficient regidity after curing cannot be obtained.

The "curing agents" of the epoxy resin include amines, such as dicyanodiamide, imidazols and aromatic amines; phenols, such as bisphenol A and brominated bisphenol A; novolaks, such as phenol novolak resin and cresol novolak resin; and acid anhydrides, such as phthalic anhydride. Since the quantity of the added curing agent to the epoxy resin is naturally derived from each equivalent weight, it is considered that there is no necessity to specify the accurate compounding proportions thereof. Therefore, in the present invention, the quantity of the added curing agent is not specifically limited.

Next, the "aromatic polyamide resin polymer" is the resin obtained by allowing an aromatic polyamide resin to react with an rubber-like resin. Here, the aromatic polyamide resin is a resin synthesized by the condensation polymerization of an aromatic diamine and a dicarboxylic acid. As the aromatic diamine at this time, 4,4'-diaminophenylmethane 3,3'-diaminophenylsulfone, m-xylenediamine, and 3,3'-oxydianiline or the like is used. As the dicarboxylic acid, phthalic acid, isophthalic acid, terephthalic acid, fumaric acid or the like is used.

The rubber-like resin allowed to react with the aromatic polyamide resin is described as the concept including natural rubber and synthetic rubbers, and the latter synthetic rubbers include styrene-butadiene rubber, butadiene rubber, butyl rubber, ethylene-propylene rubber and the like. Furthermore, when the heat resistance of the formed dielectric layer is secured, it is beneficial to select and use a synthetic rubber having heat resistant properties, such as nitrile rubber, chloroprene rubber, silicone rubber, urethane rubber or the like. Concerning these rubber-like resins, since they react with an aromatic polyamide resin to form a copolymer, it is desirable to have various functional groups at both ends. Particularly, the use of CTBN (carboxyl-group-terminated butadiene nitrile) is useful.

It is preferable that the aromatic polyamide resin and the rubber-like resin to constitute the aromatic polyamide resin polymer are used in the composition of 25% by weight to 75% by weight of the aromatic polyamide resin and the balance of the rubber-like resin. If the content of the aromatic polyamide resin is less than 25% by weight, the existence ratio of the rubber component becomes excessively large, and heat resistance becomes poor. On the other hand, if the content exceeds 75% by weight, the existence ratio of the aromatic polyamide resin becomes excessively large, hardness after curing becomes excessively high, and the polymer becomes brittle. The aromatic polyamide resin polymer is used for the purpose of preventing damage due to under-etching by the etchant when the copper foil after processing to a copper-clad laminate is etched.

The aromatic polyamide resin polymer is first required to have a property of soluble in a solvent. The aromatic polyamide resin polymer is used in a compounding proportion of 20 parts by weight to 80 parts by weight. If the proportion of the aromatic polyamide resin polymer is less than 20 parts by weight, the polymer is excessively cured under the commonly-used pressing conditions for manufacturing a copper-clad laminate, becomes brittle, and easily produces microcracks on the surface of the substrate. On the other hand, if the aromatic polyamide resin polymer is added in the excess of 80 parts by weight, there are no particular problems; however, even if the aromatic polyamide resin polymer is added in the excess of 80 parts by weight, the strength after curing in not improved any more. Therefore, if the economical efficiency is taken into account, 80 parts by weight can be said to be the upper limit.

The "curing accelerating agent added as required in an adequate quantity" is a tertiary-amine-based, imidazol-based, or urea-based curing accelerating agent. In the present invention, no specific limit is established for the compounding proportion of the curing accelerating agent. This is because the quantity of the added curing accelerating agent can be optionally and selectively determined by the manufacturer considering the producing conditions in the process of manufacturing copper-clad laminates.

(Second Resin Composition)

The second resin composition is composed of an epoxy resin (containing a curing agent), a polyether sulfone resin, and a curing accelerating agent added as required in an adequate quantity.

Since the same concept as the first resin composition can be applied to the "epoxy resin" called here, the description thereof will be omitted here. However, it is preferable that a polyfunctional epoxy resin is selectively used as much as possible in the resin composition used in the second resin composition.

The epoxy resin accounts for the most part of the resin composition, and is used in the compounding proportion of 5 parts by weight to 50 parts by weight. However, it is considered here to contain a curing agent as described in the first resin composition. Therefore, when the content of the epoxy resin in the state of containing the curing agent is less than 5 parts by weight, the thermosetting properties are not sufficiently exerted, and the function as the binder to the base-material resin and the adhesion with the copper foil cannot be exhibited; and if the content exceeds 50 parts by weight, the balance with the quantity of the added polyether sulfone resin cannot be achieved, and a sufficient toughness after curing cannot be obtained.

The polyether sulfone resin must have a structure having a hydroxyl group or an amino group at the end, and be soluble in a solvent. This is because if there is no hydroxyl group or amino group at the end, reaction with the epoxy resin cannot be performed; and if it is not soluble in a solvent, the adjustment of the solid content becomes difficult. It is used in a compounding proportion between 50 parts by weight and 95 parts by weight, considering the balance with the above-described epoxy resin. The polyether sulfone resin constitutes an insulation layer of the printed wiring board, lowers moisture absorption, and reduces the variation of the surface insulation resistance as a printed wiring board. If the content of the polyether sulfone resin is less than 50 parts by weight, the damage of the resin by a desmearing solution intensifies sharply. On the other hand, if the content of the polyether sulfone resin exceeds 95 parts by weight, swelling occurs easily in a solder heat resistant test conducted by floating on a solder bath at 260° C.

The "curing accelerating agent added as required in an adequate quantity" is a tertiary-amine-based, imidazol-based, a phosphorus compound represented by triphenyl phosphine, or a urea-based curing accelerating agent. In the present invention, no specific limit is established for the compounding proportion of the curing accelerating agent. This is because the quantity of the added curing accelerating agent can be optionally and selectively determined by the manufacturer considering the producing conditions in the process of manufacturing copper-clad laminates.

<Method for Manufacturing Copper Foil with Ultra Thin Adhesive Layer>

A method for manufacturing the above-described copper foil with ultra thin adhesive layer according to the present invention will be described. Here, there is adopted a method for manufacturing the above-described copper foil with ultra thin adhesive layer for a printed wiring board characterized in that a resin solution used in the formation of an ultra thin primer resin layer is prepared by the procedures of the following Step a and Step b; and a converted thickness of 1 to 5 μm of said resin solution is applied onto a surface of a copper foil on which a silane coupling agent layer is formed, and dried to be in a half-cured state.

The preparation of the resin solution used in the formation of an ultra thin primer resin layer will be described. First, in Step a, an epoxy resin (containing a curing agent), an aromatic polyamide resin polymer soluble in a solvent or a polyether sulfone resin, and a curing accelerating agent added as required in an adequate quantity are mixed to form a resin mixture.

When the first resin composition is obtained, 20 to 80 parts by weight of an epoxy resin (containing a curing agent), 20 to 80 parts by weight of an aromatic polyamide resin polymer soluble in a solvent, and a curing accelerating agent added as required in an adequate quantity are mixed to form a resin mixture. When the second resin composition is obtained, 5 to 50 parts by weight of an epoxy resin (containing a curing agent), 50 to 95 parts by weight of a polyether sulfone resin, and a curing accelerating agent added as required in an adequate quantity are mixed to form a resin mixture. Since the description for each component and compounding proportion is as described above, and the description here is duplicated, the description thereof will be omitted.

In Step b, the resin mixture is dissolved using an organic solvent to form a resin solution of a resin solid content of 10% by weight to 40% by weight. For example, in the case of the first resin composition, either one of solvents of methyl ethyl ketone and cyclopentanone, or a mixed solvent of these is used for dissolution. The reason why methyl ethyl ketone and cyclopentanone are used is that they can be easily and efficiently vaporized and removed by the heat history in the press work when a copper-clad laminate is manufactured, the cleanup treatment of the vaporized gas can be easily performed, and the viscosity of the resin solution can be easily adjusted to the viscosity most suitable for applying to the surface of the copper foil. In addition, it is most preferable in the present stage from an environmental point of view that a mixed solvent of methyl ethyl ketone and cyclopentanone is used for dissolution. Although the mixing ratio is not specifically limited in the case of a mixed solvent, since cyclopentanone is also used in the varnish for adjusting the aromatic polyamide resin polymer, and unavoidably mixed, considering the vaporization removal rate in the heat history when the use as a printed wiring board is considered, it is preferable to use methyl ethyl ketone as the coexistent solvent thereof assuming that cyclopentanone is unavoidably mixed. However, the use of solvents other than specifically described herein is not necessarily impossible as long as the solvents can dissolve all the resins used in the present invention.

In the case of the second resin composition, since dissolution using methyl ethyl ketone or cyclopentanone is difficult, dimethyl formamide, dimethyl acetamide, N-methylpyrrolidone or the like is used as the solvent. Particularly, the use of a solvent formed by mixing a plurality of these solvents in more preferable from the point of view to secure the quality stability of the second resin composition for a long period of time.

Using the solvent described here, a resin solution of a resin solid content of 10% by weight to 40% by weight is prepared. The range of the resin solid content shown here is the range wherein the film thickness can be most accurate when being applied on the surface of the copper foil. If the resin solid content is less than 10% by weight, the viscosity is excessively low, and the resin solution flows immediately after applying to the surface of the copper foil making it difficult to secure the uniformity of the film thickness.

When the resin solution obtained as described above is applied to the surface of the copper foil having a silane coupling agent layer, the method for applying is not specifically limited. However, when it is considered that the converted thickness of 1 μm to 5 μm of the resin solution is accurately applied, the use of so-called gravure coater useful for the formation of a thin film is preferable. For drying after the formation of a resin coating on the surface of the copper foil, heating conditions that can produce a semi-cured state depending on the characteristics of the resin solution can be suitably adopted.

Effect of the Invention

Although the copper foil with an ultra thin adhesive layer according to the present invention has a simple structure wherein a thin resin layer is formed on the adhesive surface of an untreated copper foil without roughening treatment, good adhesiveness to the base material resin of a printed wiring board can be secured.

BEST MODE FOR CARRYING OUT THE PRESENT INVENTION

The best mode for carrying out the present invention will be described below.

Example 1

In this example, a layer of a silane coupling agent was formed on the shinny surface of a surface treated copper foil of a thickness of 18 μm having a surface roughness Rz is 1.1 μm, and an ultra thin primer resin layer using the first resin composition was formed on the surface thereof to form a copper foil with an ultra thin adhesive layer. The surface-treated layer of the surface-treated copper foil contained 10 mg/m$^2$ of nickel, 8 mg/m$^2$ of zinc, and 3 mg/m$^2$ of chromium. This was laminated on FR-4 prepreg by a press work, and peel strength was measured.

First, the first resin composition to constitute an ultra thin primer resin layer was prepared. In the preparation of the first resin composition, an o-cresol novolak-type epoxy resin (YDCN-704, manufactured by Tohto Kasei Co., Ltd.), an aromatic polyamide resin polymer soluble in a solvent (BP3225-50P manufactured by Nippon Kayaku Co., Ltd. marketed as a varnish mixed with cyclopentanone as the solvent) were used as raw materials. To this mixed varnish, a phenolic resin VH-4170 manufactured by Dainippon Ink and Chemicals, Inc. as a curing agent, and 2E4MZ manufactured by Shikoku Chemicals Corporation as a curing accelerator were added to form the first resin composition having the following compound proportions.

| | |
|---|---|
| O-cresol novolak-type epoxy resin | 38 parts by weight |
| Aromatic polyamide resin polymer | 50 parts by weight |
| Phenolic resin | 18 parts by weight |
| Curing accelerator | 0.1 part by weight |

The first resin composition was further adjusted to have a resin solid content of 30% by weight using methyl ethyl ketone to form a resin solution.

On the other hand, the copper foil was immersed in a diluted sulfuric acid solution of 150 g/l of a concentration and a liquid temperature of 30° C. for 30 seconds to remove oil and fat components, and to remove an excessive surface oxide coating, and cleaned and washed with water. Then, without drying the surface, the copper foil was immersed in a solution prepared adding γ-glycidoxypropyltrimethoxysilane to ion-exchanged water to be a concentration of 5 g/l for adsorption treatment. Then, moisture was vaporized in a furnace adjusted to a 180° C. atmosphere using an electric heater for 4 seconds, and the condensation reaction of the silane coupling agent was performed to form a silane coupling agent layer.

The resin solution prepared as described above was applied to the surface of the copper foil on which the silane coupling agent layer was formed using a gravure coater. Then, air drying was performed for 5 minutes, and thereafter, a drying treatment was performed in a heated atmosphere of 140° C. for 3 minutes to form an ultra thin primer resin layer of a thickness of 1.5 μm in the semi-cured state, and the copper foil with an ultra thin adhesive layer according to the present invention was obtained. For measuring the resin flow, a copper foil with a resin having a primer resin layer of a thickness of 40 μm (hereafter referred to as a "sample for measuring the resin flow") was prepared.

From the sample for measuring the resin flow, four 10 cm-square samples were taken, and the measurement of the resin flow was conducted in accordance to the above-described MIL-P-13949G. As a result, the resin flow was 1.5%. Furthermore, using the copper foil with an ultra thin resin layer, the ultra thin primer layer side of the copper foil with an ultra thin resin layer was contacted to the FR-4 prepreg of a thickness of 150 μm, laminated, and heat-press molded under heating conditions of 180° C.×60 minutes to produce the state of a double-sided copper-clad laminate.

On the other hand, the copper-foil layers on the both surfaces of the copper-clad laminate manufactured using the copper foil with an ultra thin resin layer on which formed ultra thin primer resin layers of a thickness of 1.5 μm in the semi-cured state were flattened, and dry films were laminated on the both surfaces to form etching resist layers. Then, circuits for the peel strength measuring test of a width of 0.2 mm were exposed and developed to form etching patterns on the both etching resist layers. Thereafter, circuit etching was performed using a copper etchant, and the etching resist was peeled off to manufacture circuits. The peel strength at this time showed as very good practicable peel strength as 1.18 kgf/cm in one side and 1.21 kgf/cm in the other side.

Example 2

In this example, since the coupling agent treatment in Example 1 is merely omitted, and the description of each step will be repetitive, the description will be omitted here, and only the results of evaluation will be described.

The resin solution same as in Example 1 was applied to the surface of the copper foil using a gravure coater. Then, air drying was performed for 5 minutes, and thereafter, a drying treatment was performed in a heated atmosphere of 140° C. for 3 minutes to form an ultra thin primer resin layer of a thickness of 1.5 μm in the semi-cured state, and the copper foil with an ultra thin adhesive layer according to the present invention was obtained. For measuring the resin flow, a copper foil with a resin having a primer resin layer of a thickness of 40 μm (hereafter referred to as a "sample for measuring the resin flow") was prepared.

From the sample for measuring the resin flow, four 10 cm-square samples were taken, and the measurement of the resin flow was conducted in accordance to the above-described MIL-P-13949G. As a result, the resin flow was 2.5%. Furthermore, using the copper foil with an ultra thin resin layer, the ultra thin primer layer side of the copper foil with an ultra thin resin layer was contacted to the FR-4 prepreg of a thickness of 150 μm, laminated, and heat-press molded under heating conditions of 180° C.×60 minutes to produce the state of a double-sided copper-clad laminate.

On the other hand, the copper-foil layers on the both surfaces of the copper-clad laminate manufactured using the copper foil with an ultra thin resin layer on which formed ultra thin primer resin layers of a thickness of 1.5 μm in the semi-cured state were flattened, and dry films were laminated on the both surfaces to form etching resist layers. Then, circuits for the peel strength measuring test of a width of 0.2 mm were exposed and developed to form etching patterns on the both etching resist layers. Thereafter, circuit etching was performed using a copper etchant, and the etching resist was peeled off to manufacture circuits. The peel strength at this time showed as very good practicable peel strength as 1.03 kgf/cm in one side and 1.00 kgf/cm in the other side.

Example 3

In this example, a silane coupling agent layer was formed on the shinny surface of an untreated 18μ copper foil same as in Example 1 having a surface roughness Rz of 1.1 μm, and an ultra thin primer resin layer was formed on the surface thereof using the second resin composition to produce a copper foil with an ultra thin adhesive layer. Since the first resin composition in Example 1 was merely substituted by the second resin composition described below, and the description of each step will be repetitive, the description of the repetitive parts will be omitted here, and only the second resin composition and the results of evaluation will be described.

The second resin composition constituting the ultra thin primer resin layer was prepared as described below. In the preparation of the second resin composition, an epoxy resin (EPPN-502, manufactured by Nippon Kayaku Co., Ltd.), and a polyether sulfone resin (Sumika Excel PES-5003P, manufactured by Sumitomo Chemical Co., Ltd.) were used as raw materials. To this mixed varnish, an imidazol-based 2P4 MHZ (manufactured by Shikoku Chemicals Corporation) was added as a curing accelerator to form the second resin composition. By varying the mixing ratios of these, a plurality of compounding proportions (second resin composition A to second resin composition E) were adopted and implemented. Each of these second resin compositions was further adjusted to have the resin solid content of 30% by weight using dimethyl formamide to form resin solutions. The compounding is shown in Table 1.

Then, each of resin solution having different compositions was applied to the surface of the copper foil using a gravure coater. Then, air drying was performed for 5 minutes, and thereafter, a drying treatment was performed in a heated atmosphere of 180° C. for 1 minute to form an ultra thin primer resin layer of a thickness of 1.5 μm in the semi-cured state, and the copper foil with an ultra thin adhesive layer according to the present invention was obtained. For measuring the resin flow, a copper foil with a resin having a primer resin layer of a thickness of 40 μm (hereafter referred to as a "sample for measuring the resin flow") was prepared.

From the sample for measuring the resin flow, four 10 cm-square samples were taken, and the measurement of the resin flow was conducted in accordance to the above-described MIL-P-13949G. As a result, the resin flow was 1.8%. Furthermore, using the copper foil with an ultra thin resin layer, the ultra thin primer layer side of the copper foil with an ultra thin resin layer was contacted to the FR-4 prepreg of a thickness of 150 μm, laminated, and heat-press molded under heating conditions of 180° C.×60 minutes to produce the state of a double-sided copper-clad laminate.

On the other hand, the copper-foil layers on the both surfaces of the copper-clad laminate manufactured using the copper foil with an ultra thin resin layer on which formed ultra thin primer resin layers of a thickness of 1.5 μm in the semi-cured state were flattened, and dry films were laminated on the both surfaces to form etching resist layers. Then, circuits for the peel strength measuring test of a width of 0.2 mm were exposed and developed to form etching patterns on the both etching resist layers. Thereafter, circuit etching was performed using a copper etchant, and the etching resist was peeled off to manufacture circuits. The peel strengths at this time are listed in Table 1.

TABLE 1

|  |  |  | Second resin composition A | Second resin composition B | Second resin composition C | Second resin composition D | Second resin composition E |
|---|---|---|---|---|---|---|---|
| Resin composition | Epoxy resin | Parts by weight | 50 | 40 | 30 | 20 | 5 |
|  | PES* | Parts by weight | 50 | 60 | 70 | 80 | 95 |
|  | Curing accelerator | Parts by weight | 1 | 1 | 1 | 1 | 1 |
|  | Total parts by weight |  |  |  | 101 |  |  |
| Peel strength | One side | kgf/cm | 0.60 | 0.75 | 0.83 | 0.96 | 1.17 |
|  | The other side |  | 0.62 | 0.78 | 0.85 | 0.97 | 1.19 |
| Solder float test |  | Seconds | ≥600 | ≥600 | 543 | 538 | 480 |

*PES: polyether sulfone resin

COMPARATIVE EXAMPLES

Comparative Example 1

In this comparative example, a copper foil with a resin layer was manufactured by changing the thickness of the ultra thin primer resin layer in a semi-cured state of Example 1 by 20 μm.

From the copper foil with a resin layer, four 10 cm-square samples were taken, and the measurement of the resin flow was conducted in accordance to the above-described MIL-P-13949G. As a result, the resin flow was 0.5%. Furthermore, using the copper foil with a resin layer, the resin layer side of the copper foil with a resin layer was contacted to the FR-4 prepreg of a thickness of 150 μm, laminated, and heat-press molded under heating conditions of 180° C.×60 minutes to produce the state of a double-sided copper-clad laminate.

Circuits for the peel strength measuring test of a width of 0.2 mm, as in the example were exposed and developed on the copper foil layers on the both surfaces of the copper-clad laminate manufactured as described above, to form etching patterns on the both etching resist layers. Thereafter, circuit etching was performed using a copper etchant, and the etching resist was peeled off to manufacture circuits. The peel strength at this time showed as much lower peel strength than Example 1 to Example 3 as 0.28 kgf/cm in one side and 0.31 kgf/cm in the other side, because of boundary delamination from the prepreg.

Comparative Example 2

In this comparative example, a resin layer was formed on the shinny surface of an untreated 18 μm thickness copper foil having a surface roughness Rz is 1.1 μm used in examples using a kind of the resin composition disclosed in the above-described Patent Document 2, to form a copper foil with an adhesive layer.

First, the following resin composition described as a manufacturing example of Patent Document 2 was manufactured. Specifically, 100 parts by weight of a polyvinyl butiral resin (Denki Kagaku Kogyo K.K., Product No.: 6000C, average degree of polymerization: 2,400), 25 parts by weight of a cresol novolak-type epoxy resin (Dainippon Ink and Chemicals, Inc., Product No.: N-673), and 20 parts by weight of an amino resin (Fuji Kasei Kogyo Co., Ltd., Delamine CTU-100) were dissolved in a mixed solvent consisting of toluene, methyl ethyl ketone, and methanol, and then, 4 parts by weight of an imidazol compound (Shikoku Chemicals Corporation, Product No.: 2E4MZCN) and 1 part by weight of hexamethylene diisocyanate were added to prepare a resin composition of a solid content of 18% by weight.

This resin composition was applied to the shinny surface of the above-described untreated copper foil. For applying, a bar coater of 60-μm gap is used, and drying was performed in the air at room temperature for 10 minutes, at 60° C. for 5 minutes, and at 120° C. for 5 minutes. Thereby, a copper foil with a resin layer of a thickness after drying of 5 μm was formed.

From the copper foil with a resin layer, four 10 cm-square samples were taken, and the measurement of the resin flow was conducted in accordance to the above-described MIL-P-13949G. As a result, the resin flow was 8.1%. Furthermore, using the copper foil with a resin layer, the resin layer side of the copper foil with a resin layer was contacted to the FR-4 prepreg of a thickness of 150 μm, laminated, and heat-press molded under heating conditions of 180° C.×60 minutes to produce the state of a double-sided copper-clad laminate.

Circuits for the peel strength measuring test of a width of 0.2 mm, as in the example, were exposed and developed on the copper foil layers on the both surfaces of the copper-clad laminate manufactured as described above, to form etching patterns on the both etching resist layers. Thereafter, circuit etching was performed using a copper etchant, and the etching resist was peeled off to manufacture circuits. The peel strength at this time showed as much lower peel strength than Example 1 to Example 3 as 0.45 kgf/cm in one side and 0.38 kgf/cm in the other side, because of boundary delamination from the prepreg. Moreover, it can be understood that even if one of the resin compositions disclosed in Patent Document 2 is used, the peel strength of an equivalent degree of the copper foil with an ultra thin adhesive layer according to the present invention as shown in Example 1 to Example 3 cannot be obtained.

INDUSTRIAL APPLICABILITY

The copper foil with an ultra thin resin layer according to the present invention has a structure as simple as providing a thin resin layer on the adhesive surface of an untreated copper foil without roughening treatment. However, good adhesiveness with a base-material resin can be secured as defying the conventional common sense of printed wiring board industry. Since a copper foil without roughening treatment is used, the formation of fine-pitch patterns is easier than a copper foil undergone normal roughening treatment, and circuit formation of the level required for packaged products is also easy. Since the copper foil with an ultra thin resin layer according to the present invention has a simple layer structure, the manufacturing process thereof is very simple, substantial process steps can be omitted compared to conventional copper foils with resin layers, and the manufacturing costs of copper foils with resin can be significantly reduced. Moreover, since a copper foil without a roughening treated layer is used, no over-etching time is required in the process of circuit etching, and the processing costs can be significantly reduced.

BRIEF DESCRIPTION OF THE DRAWING

FIG. 1 is a schematic sectional view of a copper foil with an ultra thin resin layer provided with an ultra thin-primer resin layer on one side of the copper foil.

DESCRIPTION OF SYMBOLS

1 Copper foil with an ultra thin resin layer
2 Silane coupling agent layer
3 Copper foil layer
4 Ultra thin primer resin layer

The invention claimed is:

1. A copper foil with an ultra thin adhesive layer for a printed wiring board comprising the ultra thin adhesive layer having a thickness of 1 to 3 μm, provided on a surface of the copper foil that has not undergone a roughening treatment, and as a result does not have fine copper particles adhering to the surface of the copper foil attributable to the roughening treatment, and has a surface roughness (Rz) of 2 μm or less, and wherein said ultra thin adhesive layer is formed using a resin mixture consisting of 20 to 80 parts by weight of an epoxy resin that may contain a curing agent, 20 to 80 parts by weight of a solvent-soluble aromatic polyamide resin polymer, and an effective amount of a curing accelerator, and
wherein a resin flow of the ultra-thin adhesive layer when measured in accordance with MIL-P-13949G in the MIL Standard is 5% or less, and for the purpose of the resin flow measurement a thickness of the ultra-thin adhesive layer has been increased to 40 μm.

2. The copper foil with an ultra thin adhesive layer for a printed wiring board according to claim 1, comprising a silane coupling agent layer on the surface of the copper foil provided with the ultra thin adhesive layer.

3. The copper foil with an ultra thin adhesive layer for a printed wiring board according to claim 2, wherein said silane coupling agent layer is formed using an amino-based silane coupling agent or a mercapto-based silane coupling agent.

4. The copper foil with an ultra thin adhesive layer for a printed wiring board according to claim 1, wherein said aromatic polyamide resin polymer used for said ultra thin adhesive layer is obtained by allowing an aromatic polyamide resin to react with a rubber resin.

5. The copper foil with an ultra thin adhesive layer for a printed wiring board according to claim 4, wherein the aromatic polyamide resin is present in said aromatic polyamide resin polymer of said ultra thin adhesive layer in an amount of 25 to 75 wt %, with the balance being said rubber resin.

6. A copper foil with an ultra thin adhesive layer for a printed wiring board comprising the ultra thin adhesive layer having a thickness of 1 to 3 μm provided on a surface of the copper foil that has not undergone a roughening treatment, and as a result does not have fine copper particles adhering to the surface of the copper foil attributable to the roughening treatment, and has a surface roughness (Rz) of 2 μm or less, and wherein said ultra thin adhesive layer is formed using a resin mixture consisting of 5 to 50 parts by weight of an epoxy resin that may contain a curing agent, 50 to 95 parts by weight of a polyether sulfone resin, and an appropriate quantity added as required of a curing accelerator, and wherein a resin flow of the ultra-thin adhesive layer when measured in accordance with MIL-P-13949G in the MIL Standard is 5% or less, and for the purpose of the resin flow measurement a thickness of the ultra-thin adhesive layer has been increased to 40 μm.

7. The copper foil with an ultra thin adhesive layer for a printed wiring board according to claim 6, wherein the polyether sulfone resin has a hydroxyl group or an amino group at a proximal end, and is soluble in a solvent.

8. The copper foil with an ultra thin adhesive layer for a printed wiring board according to claim 6, comprising a silane coupling agent layer on the surface of the copper foil provided with the ultra thin primer resin layer.

9. The copper foil with an ultra thin adhesive layer for a printed wiring board according to claim 8, wherein said silane coupling agent layer is formed using an amino-based silane coupling agent or a mercapto-based silane coupling agent.

10. A copper-clad laminate comprising a copper foil with an ultra thin adhesive layer for a printed wiring board according to claim 1.

11. A copper-clad laminate comprising a copper foil with an ultra thin adhesive layer for a printed wiring board according to claim 2.

12. A copper-clad laminate comprising a copper foil with an ultra thin adhesive layer for a printed wiring board according to claim 3.

13. A copper-clad laminate comprising a copper foil with an ultra thin adhesive layer for a printed wiring board according to claim 4.

14. A copper-clad laminate comprising a copper foil with an ultra thin adhesive layer for a printed wiring board according to claim 6.

15. A method for manufacturing a copper foil with an ultra thin adhesive layer for a printed wiring board comprising:

forming a resin mixture by mixing (1) an epoxy resin, which contains a curing agent, (2) an aromatic polyamide polymer soluble in a solvent or a polyether sulfone resin, and (3) an appropriate quantity added as required of a curing accelerator;

dissolving the resin mixture using an organic solvent to form a resin solution of a resin solid content of 10% by weight to 40% by weight;

applying the resin solution onto a surface of a copper foil that has not undergone a roughening treatment, and as a result does not have fine copper particles adhering to the surface of the copper foil attributable to the roughening treatment, on which a silane coupling agent layer has been formed to form a resin layer; and drying the resin layer to a semi cured state, wherein the thickness of the resin layer is 1 to 3 μm.

* * * * *